(12) United States Patent (10) Patent No.: US 7,939,971 B2
Hartmann (45) Date of Patent: May 10, 2011

(54) METHOD FOR GENERATING INTENSIVE HIGH-VOLTAGE PULSES FOR INDUSTRIAL USE AND ASSOCIATED CIRCUIT

(75) Inventor: Werner Hartmann, Weisendorf (DE)

(73) Assignee: Sudzucker Aktiengesellschaft, Ochsenfurt (DE)

( * ) Notice: Subject to any disclaimer, the term of this patent is extended or adjusted under 35 U.S.C. 154(b) by 227 days.

(21) Appl. No.: 11/992,743

(22) PCT Filed: Sep. 27, 2006

(86) PCT No.: PCT/EP2006/066805
§ 371 (c)(1),
(2), (4) Date: Mar. 3, 2009

(87) PCT Pub. No.: WO2007/036542
PCT Pub. Date: Apr. 5, 2007

(65) Prior Publication Data
US 2009/0184585 A1    Jul. 23, 2009

(30) Foreign Application Priority Data

Sep. 28, 2005 (DE) .......................... 10 2005 046 411

(51) Int. Cl.
*H03K 3/64* (2006.01)
(52) U.S. Cl. ........................................................ 307/108
(58) Field of Classification Search ................ 307/108, 307/106, 110
See application file for complete search history.

(56) References Cited

U.S. PATENT DOCUMENTS

| | | | |
|---|---|---|---|
| 2,881,346 A | | 4/1959 | Johnson |
| 3,343,007 A | | 9/1967 | Massey |
| 3,379,928 A | | 4/1968 | Barbini |
| 3,746,881 A | * | 7/1973 | Fitch et al. ..................... 307/110 |
| 3,845,322 A | * | 10/1974 | Aslin ............................. 307/108 |
| 4,274,134 A | * | 6/1981 | Johannessen ................... 363/59 |
| 5,798,579 A | * | 8/1998 | McPhee ........................ 307/106 |
| 6,058,029 A | * | 5/2000 | Itow et al. ....................... 363/59 |
| 6,060,791 A | * | 5/2000 | Goerz et al. .................. 307/110 |
| 6,166,459 A | * | 12/2000 | Holland et al. ............... 307/109 |
| 7,170,198 B2 | * | 1/2007 | Sack ............................. 307/106 |

FOREIGN PATENT DOCUMENTS

| | | |
|---|---|---|
| DE | 16433 | 3/1959 |
| DE | 103 20 425 A1 | 12/2004 |
| FR | 1.436.675 | 3/1966 |
| WO | 2004/100371 A1 | 11/2004 |

OTHER PUBLICATIONS

PCT International Search Report for Application No. PCT/EP2006/066805; mailed Feb. 12, 2007.
Schultheiss et al., "Industrial-scale Electroporation of Plant Material Using High Repetition Rate Marx Generators", IEEE Pulsed Power Conference, 2002, 4 pp.
Schultheiss et al, "Operation of 20 Hz Marx Generators on a Common Electrolytic Load in an Electroporation Chamber", IEEE Power Modulator Symposium, 2003; pp. 669-672.
Kirbie et al., "All-Solid-State Marx Modulator with Digital Pulse-Shape Synthesis", Los Alamos National Laboratory, 2005; pp. 1-12.
Schultheiss et al., "Wear-less Trigger Method for Marx Generators in Repetitive Operation", IEEE Power Modulator Symposium, 2003; pp. 1415-1418.

* cited by examiner

*Primary Examiner* — Albert W Paladini
(74) *Attorney, Agent, or Firm* — Staas & Halsey LLP

(57) ABSTRACT

High-voltage pulses are generated and injected in a parallel-capacitative manner into the first stage of a multistage Marx generator at suitable intervals. The high-voltage pulses result in a longitudinal overvoltage triggering of the first spark gap of the Marx generator. As a result, industrial applications are able to generate, in a fault-free manner, high-voltage pulses having a predetermined repetition rate over a prolonged period of time.

21 Claims, 2 Drawing Sheets

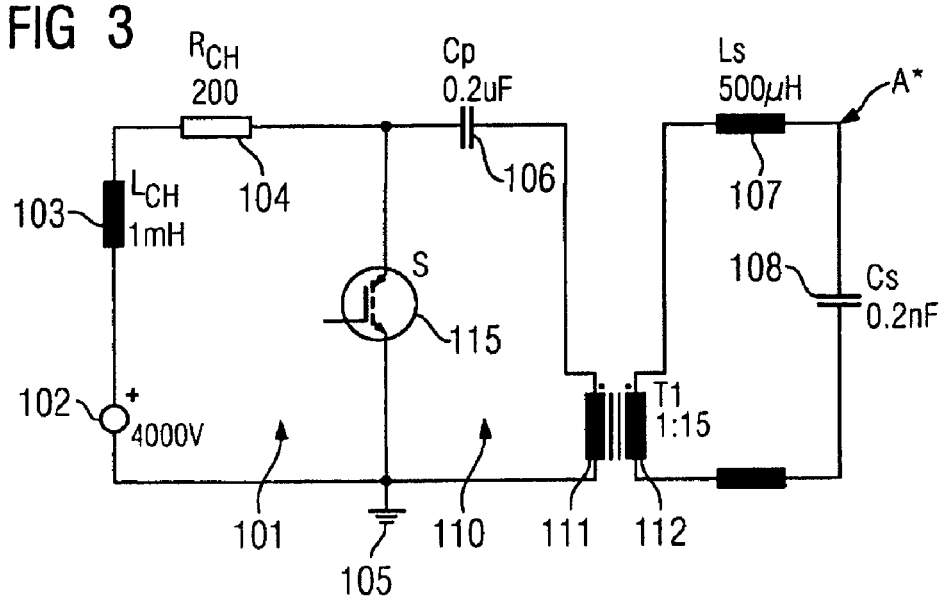
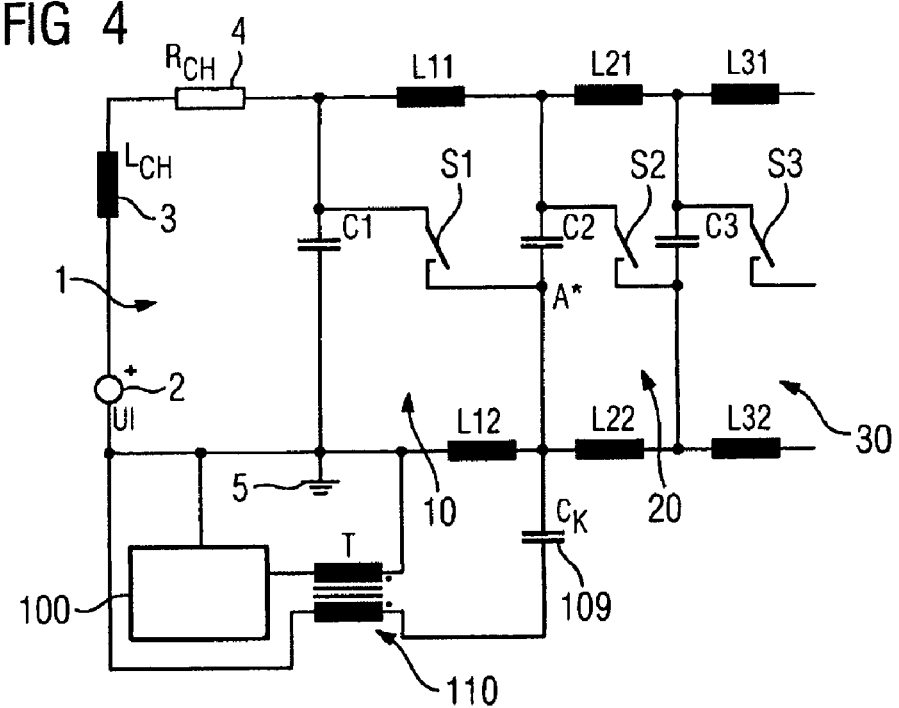

METHOD FOR GENERATING INTENSIVE HIGH-VOLTAGE PULSES FOR INDUSTRIAL USE AND ASSOCIATED CIRCUIT

CROSS REFERENCE TO RELATED APPLICATIONS

This application is based on and hereby claims priority to German Application No. 10 2005 046 411.4 filed on Sep. 28, 2005, the contents of which are hereby incorporated by reference.

BACKGROUND

Described below is a method for generating intensive high-voltage pulses and for the industrial use of these high-voltage pulses and an associated circuit arrangement for carrying out the method.

Intensive high-voltage pulses are used for numerous industrial processes. For example,
in construction engineering, building materials are made accessible for quality analysis by an electrohydraulic material breakdown such as, e.g., concrete or asphalt, or building materials such as, e.g., reinforced steel concrete are recycled by shockwave-based, i.e. electrohydraulic methods.

Other possible uses of intensive high-voltage pulses as a part of industrial applications are, for example,
in biotechnology, in which cell proteins, DNA or other cell content or cell wall components are extracted from biological cells by electroporation of the cell walls, or
in environmental technology in which, e.g., slurry is preprocessed by electroporation in order to control putrefaction processes better by this means.

Other possible fields of use of high-voltage pulses are found in the treatment or sterilization of agricultural products, particularly for eliminating animal and fungal damage by destroying the cell bond due to the high electrical fields on the outer skin of the agricultural products when these are brought into an area of sufficiently high electrical field strength (reactor).

The above applications in the use of high-voltage pulses are addressed partially in publications by Schultheiss et al. "INDUSTRIAL-SCALE ELECTROPORATION OF PLANT MATERIAL USING HIGH REPETITION RATE MARX GENERATORS", Proceedings IEEE Pulsed Power Conference, 2002 and "OPERATION OF 20 HZ MARX GENERATORS ON A COMMON ELECTROLYTIC LOAD IN AN ELECTROPORATION CHAMBER", Proceedings IEEE Power Modulator Symposium, 2003.

Such applications typically require pulse amplitudes of some 100 kV at current intensities of some 10 kA with pulse rates of some 10 pulses per second (pps) in continuous operation. In methods used industrially, a maintenance-free plant life of some 100 million pulses is essential for the economic running of such plants.

To produce the high field strengths necessary, high-voltage pulse generators according to the Marx principle are used, corresponding to the prior art, in which capacitors are charged up in parallel but are connected in series by suitable switches for generating pulses which is shown as prior art in FIG. 1 and will be described in detail below.

The main problem in the generation of pulses is the switches needed for it, in most cases gas-filled spark gaps, and their selective triggering with high accuracy over the entire life.

In a known solution of the problem, spark gaps are used for the switches which are designed in such a manner that they should achieve a life of over 100 million pulses. First solutions to the problem exist for Marx generators with electronic switching elements in accordance with the publication by Kirbie et al. "All-Solid-State Marx Modulator with Digital Pulse-Shape Synthesis", report No. LA-UR-05-0631, Los Alamos National Laboratory, Los Alamos, N. Mex., USA 2005. However, the latter solutions to the problem do not yet achieve sufficiently high currents for industrial use.

According to the publication by Schultheiss et al., "Wearless Trigger Method for Marx Generators in Repetitive Operation", Proceedings IEEE Power Modulator Symposium, 2003, the gas discharge switches used hitherto for Marx generators in repetitive operation are in most cases used untriggered in such a manner that the spacing of the spark gap electrodes of the first Marx generator stage has a somewhat smaller spacing than that of the other stages; as a result, the breakdown voltage of these spark gaps is slightly less than that of the following ones and the first stage arcs through as the first one. As a result, an overvoltage of almost 100% of the charging voltage is generated at the second spark gap, as a result of which the second stage also arcs through. Analogously, the following stages then also arc through until the entire Marx generator is raised up and generates a corresponding pulse at the output.

To achieve a greater total current and thus a higher total power, it is often necessary to operate a number of such systems in parallel. However, this requires, in particular, synchronizing the time of pulse generation of the individual Marx generators with high accuracy in time. This synchronization is also necessary for an individual system if good control of the operating parameters is required for the desired process. Synchronization is generally effected by the fact that the ignition of the spark gap of the first stage does not occur by exceeding the ignition voltage during the charging process but this spark gap is deliberately ignited. There are several possibilities available for this ignition:
plasma cross triggering (Trigatron)
longitudinal plasma triggering
longitudinal overvoltage triggering
laser triggering.

Both plasma cross triggering and longitudinal plasma triggering have hitherto not displayed sufficiently long lives. Laser triggering requires very high equipment expenditure and costs with limited life of the spark gap and is therefore used in most cases only for single pulse operation in very large research installations.

Longitudinal overvoltage triggering is the most suitable method. However, there has hitherto not been any practice-oriented device having sufficiently good characteristics and an adequate life. WO 2004/100371 A1 discloses a triggering/ignition device in a Marx generator having step capacitances and an associated operating method for this device. In the method for generating high-voltage pulses applied there, the Marx generator is triggered with high-voltage pulses, the trigger pulses being coupled in serially-inductively.

In practice, the solution described above provides neither a sufficiently high trigger quality nor an adequate life. It is based on inductively coupling a voltage pulse into the charging inductance at the ground end of the first Marx stage (pulse transformer) which is generated in an auxiliary winding (primary winding) by electronically interrupting a current with the aid of semiconductor switches. In this arrangement, the energy necessary for generating the overvoltage and igniting the spark gap must be temporarily stored in the winding on the primary side of the pulse transformer which leads to very unfavorable design criteria of this arrangement. Furthermore, the opening electronic switching element is in most cases an IGBT at the instant of pulse generation in the open state, as a result of which it is very sensitive to reactions from the Marx generator, particularly to overvoltages.

In general, the latter leads to such a circuit having a limited life which is not sufficient for industrial use. Furthermore, it is very difficult to scale this principle since great compromises have to be made with regard to conflicting requirements. For example, the provision of sufficiently high pulse energies for reliable ignition of the spark gap requires high self-inductance of the primary winding, whilst the requirement for great steepness of the pulse generated in this manner requires an inductance which is as low as possible.

SUMMARY

Therefore, an aspect is to specify a method for triggering a Marx generator and to create a suitable Marx generator in which the efficiency is increased so that new industrial applications are possible. In particular, a triggerable Marx generator with a device for generating and coupling high-voltage pulses into the first stage of the Marx generator is to be created which leads to a reliable longitudinal overvoltage triggering of the first spark gap of the Marx generator with little statistical fluctuation of the ignition time titter), with a life of the arrangement of over 200 million pulses.

A known Marx generator is used in which the trigger pulse can preferably be coupled in serially-capacitively. Surprisingly, this produces an improved efficiency compared with an inductive coupling-in, which is also possible. In particular, this eliminates the otherwise disturbing jitter better than in the prior art.

Accordingly, the secondary side of a pulse transformer T is inserted into the feed line at the frame of the charging inductance at the ground end of the first stage of a Marx generator, which pulse transformer is connected to a circuit for pulse generation on its primary side. The transformer T has a transformation ratio Ü (number of secondary-side/primary-side turns) within the range from 8:1 to 20:1, preferably within the range of 15:1. On the primary side, only a few turns are preferably used, preferably only one or two turns in order to keep down the inductance of the arrangement and thus to generate pulses of sufficiently short duration.

The charging inductance can be dimensioned within the range from 100 µH to 2 mH without negatively influencing the operability of the circuit. The same charging inductance can be used as for all other stages.

For the pulse transformer T, a toroidal ferrite core or an amorphous annular cut strip-wound core with core dimensions in the range of a few cm² cross section is preferably used. The windings can be applied both directly to the core with high-voltage-insulated cable and to an insulating coil former or separate coil formers; direct application of the primary winding to the core and application of the secondary winding to an insulating coil former is also possible. The arrangement can be insulated both in insulating gas atmosphere and in insulating liquid (oil, silicone oil, etc.). Casting using suitable resins or other polymers is also possible.

The circuit at the primary side for generating the high-voltage pulse is preferably arranged in such a manner that a capacitor $C_p$ charged up to a predetermined voltage is discharged into the primary winding of the pulse transformer with the aid of a closing semiconductor switch. The capacitance of the capacitor $C_p$ is selected to be at least so great that the relation $$C_p = \ddot{U}^2 * C_s \tag{1}$$

is satisfied, where $C_s$ is the entire stray capacitance of the node A* in FIG. 3, i.e. at the end of the spark gap close to ground of the first stage of the Marx generator. The capacitance is preferably selected to be about 3- to 4-times as great in order to provide sufficient energy reserves for triggering an ignition spark in the spark gap FS1. Typical stray capacitances are within the range of a few 100 pF, typically approx. 200 pF so that, with a transformation ratio of Ü=15, a capacitance at the primary side of at least $$C_p = \ddot{U}^2 * C_s = 225 * 200 \text{ pF} = 45 \text{ nF} \tag{2}$$

is required, but better $C_p$=150 ... 200 nF. The charging voltage of the capacitor is selected to be at least great enough that the relation $$U_{Cp} = U_L / \ddot{U} \tag{3}$$

is satisfied; this generates a series overvoltage of approx. 100% of the Marx charging voltage $U_L$ at the spark gap FS1 so that it ignites with a short delay and little jitter. With a step voltage $U_L$ of the Marx generator of 60 kV, a charging voltage of $$U_{Cp} = U_L / \ddot{U} = 60 \text{ kV}/15 = 4 \text{ kV} \tag{4}$$

is thus needed for $C_p$.

Link voltages of approx. 4 kV at pulse currents of typically 500 A amplitude can be processed without problems using available power semiconductors as the switching element S. E.g., thyristor components such as GTOs or IGCTs and transistor switches such as IGBTs with cut-off voltages above 5 kV are suitable.

A closing semiconductor switch is advantageously used. This is particularly advantageous, therefore, because the use of commercial semiconductor components provides a long life and little sensitivity to reaction from the Marx generator because the semiconductor switching element remains in the closed state during the main pulse. Using the charging inductance used in the higher Marx stages is also possible in the first stage and, due to designing the pulse generation at the ground end, it is possible to use a grounded power supply of any power.

The high-voltage pulse necessary for igniting the spark gap is not inductively coupled in series with the charging inductance but with a serial capacitance $C_K$ for decoupling direct-current and slow alternating-current components. To keep the voltage loss due to capacitive voltage division across $C_K$ low, the condition $$C_K \gg C_s, \text{ but at least } C_K = (5 \ldots 10) * C_s \tag{5}$$

should be met.

Thus, excellent scalability with all necessary degrees of freedom is produced, there being no restrictions for the operation with regard to pulse amplitude, pulse energy or pulse repetition rate and life.

BRIEF DESCRIPTION OF THE DRAWINGS

These and other aspects and advantages will become more apparent and more readily appreciated from the following description of exemplary embodiments, taken in conjunction with the accompanying drawings of which:

FIG. 3 shows an equivalent circuit diagram of the circuit for generating high-voltage pulses for triggering the Marx generator according to FIG. 2, and FIG. 4 shows an equivalent circuit diagram of a Marx generator with capacitive coupling-in of the trigger pulse in the first stage.

DETAILED DESCRIPTION OF THE PREFERRED EMBODIMENT

Figure 1:
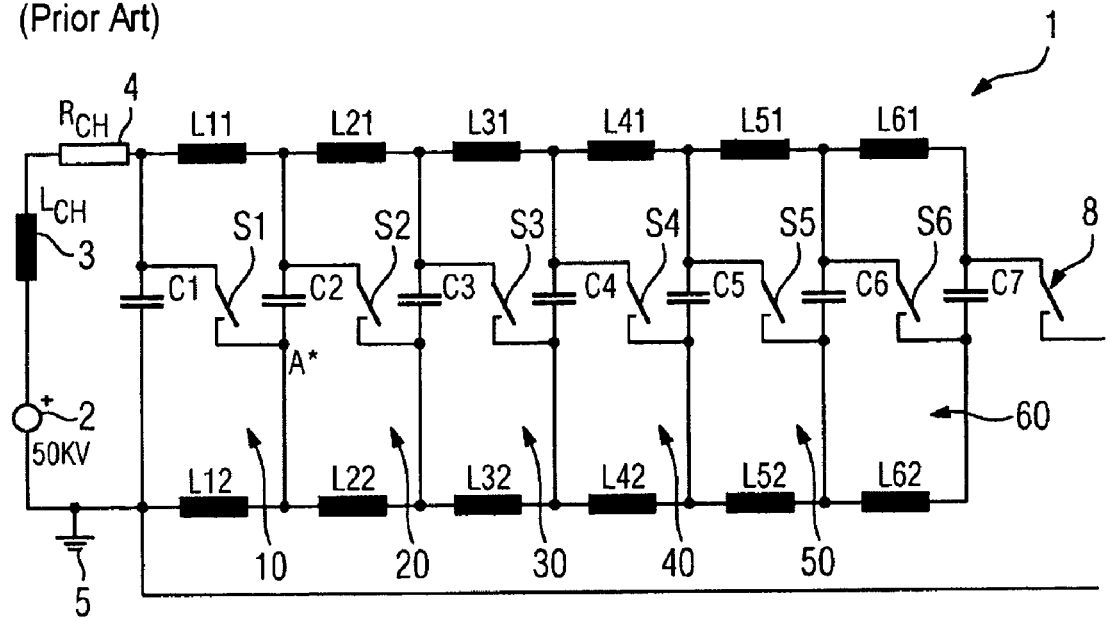
FIG. 1 shows a basic circuit diagram of a Marx generator according to the prior art.

Reference will now be made in detail to the preferred embodiments, examples of which are illustrated in the accompanying drawings, wherein like reference numerals refer to like elements throughout.

FIG. 1 shows the basic circuit of a known Marx generator which is designated by 1 overall. In detail, the Marx generator 1 has a voltage source 2, for example a source having a direct voltage of 50 kV which is preceded by an inductance 3 and an ohmic resistance 4. There is also a ground connection 5.

Such a Marx generator 1 has in known manner a number of individual stages, for example six stages in accordance with FIG. 1. Each stage i contains a switch $S_i$, a first inductance $L_{ik}$, a further inductance $L_{ik+1}$ and a capacitance $C_i$, i and k representing running indexes. In other embodiments, resistors or high-voltage rectifiers can be used instead of the inductances $L_{ik}$. In the text which follows, however, only inductances $L_{ik}$ are mentioned. For example, the third stage of the Marx generator has a switch $S_3$ with spark gap, a capacitor $C_3$, a first inductance $L_{31}$ and a second inductance $L_{32}$.

In FIG. 1, direct triggering of the individual spark gaps according to the arrows is indicated. However, this type of triggering can only be used with short lives of the switches and generally also not in all stages.

Figure 2:
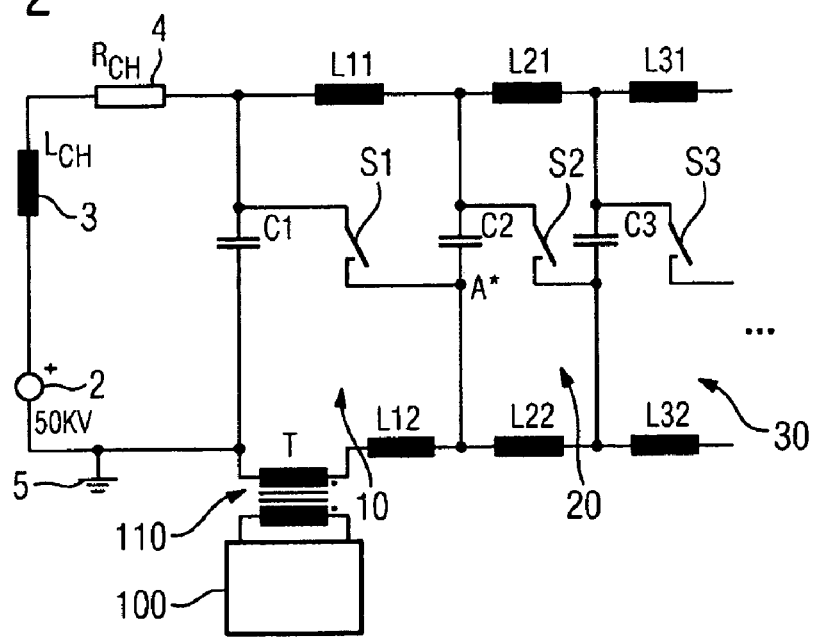
FIG. 2 shows an equivalent circuit diagram of a Marx generator with inductive-serial coupling-in of the trigger pulse in the first stage.

In FIG. 2, a trigger pulse generator 100 is allocated to the first stage 10 of the Marx generator according to FIG. 1. The trigger pulse generator 100 couples a trigger pulse into the first stage 10 of the Marx generator via a transformer 110. The coupling-in occurs inductively-serially at the inductance $L_{12}$.

FIG. 3 shows an improved alternative to FIG. 2. In this case, the trigger pulse is coupled capacitively into the inductance $L_{12}$ of the first stage 10 of the Marx generator 1 via the trigger pulse generator 100 and the preceding transformer 110 and via a coupling capacitance 109. This has the advantage that the jitter, which is unavoidable otherwise, can be reduced. This increases the efficiency.

In FIG. 3, a switch S is designated by 115. For its application according to definition, the switch 115 is constructed as closing semiconductor switch, for example as IGCT with a cut-off voltage of at least 5 kV. Such semiconductor switches are commercially available.

Using commercial semiconductor components ensures, on the one hand, a long life and, on the other hand, provides low sensitivity to reaction from the Marx generator since the semiconductor switching element remains in the closed state during the main pulse.

FIG. 4 illustrates how the trigger pulse is coupled in. According to FIG. 2 or FIG. 3, the transformer 110 is shown which, for example, has a transformation ratio of 1:15. There is a voltage source 102 for, for example, 4000 V which is preceded by an inductance 103 and an ohmic resistance 104. The inductance 103 has a value of, for example, LCH=1 mH and the ohmic resistance 104 has a value of, for example, RCH=200Ω. There is furthermore a capacitance 106 having a value of $C_p$=0.2 µF, a further capacitance 108 having a value of $C_s$=0.2 nF corresponding to the load capacitance at point A* of the first stage of the Marx generator, and a further inductance 107 having a value of $L_s$=500 µH.

A particular advantage of the capacitive-parallel coupling-in of the pulse is that, due to the decoupling of direct voltage components via the coupling capacitance $C_K$, the stray inductance of the pulse transformer T is kept much lower than the associated parallel charging inductance $L_{12}$. Thus, much steeper voltage edges can be generated at point A* as a result of which much smaller jitter values can be generated. A further advantage is obtained by the fact that higher voltage amplitudes can be achieved since the inductive voltage drop across $L_{12}$ is lacking with inductive-serial coupling-in.

Using the circuit arrangement according to FIG. 4, a pulse is coupled via the inductance $L_{12}$ to the stray capacitance $C_s$ at the point A* located between $L_{12}$ and $C_s$ via the pulse transformer 110.

In the circuit arrangement described by FIGS. 1 to 4, a long life is ensured by using commercial semiconductor components for the switch 115. It results in a low sensitivity to the reaction from the Marx generator since the semiconductor switching element remains in the closed state during the main pulse.

Due to the stability of the circuit, continuous use of the circuit arrangement with pulse repetition rates of from 10 to 20 Hz can be managed for an uninterrupted operating time of a plant of typically 100 days, and a maintenance-free plant life of over 100 million pulses can be achieved.

The circuit arrangement described above is used, for example, in the sterilization of agricultural products by strong electrical fields. In particular, grain, corn, hops, tomatoes and fruit can be preserved by this means.

Another possible use is the extraction of cell content substances or building blocks of shells (proteins) from cells in the pharmaceutical and chemical industry. For example, a biological breakdown of blood can be performed.

Furthermore, the method described by the new Marx generator for generating high-voltage pulses is suitable for use in the treatment of water and waste water.

Finally, use in the analysis of building materials, particularly of asphalt and concrete, is also possible where asphalt or concrete samples are electrohydraulically disintegrated and broken down. In addition, the use in the recycling of building materials such as concrete and asphalt by electrohydraulic disintegration and subsequent breakdown is possible.

The system also includes permanent or removable storage, such as magnetic and optical discs, RAM, ROM, etc. on which the process and data structures of the present invention can be stored and distributed. The processes can also be distributed via, for example, downloading over a network such as the Internet. The system can output the results to a display device, printer, readily accessible memory or another computer on a network.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide* v. *DIRECTV*, 358 F3d 870, 69 USPQ2d 1865 (Fed. Cir. 2004).

The invention claimed is:

1. A method for industrial use of intensive high-voltage pulses in which a pulse transformer and a transformer are used, comprising:
   generating high-voltage pulses in a first stage of a Marx generator, having multiple stages and a first spark gap, by discharging a capacitive energy store by closing a semiconductor switch, where the high-voltage pulses are coupled parallel-capacitively thereby minimizing jitter; and triggering the Marx generator with the high-voltage pulses at desired times, leading to longitudinal overvoltage triggering of the first spark gap of the Marx generator.

2. The method as claimed in claim 1, further comprising sterilizing at least one of grain, corn, hops, tomatoes and fruit by applying strong electrical fields produced by the Marx generator.

3. The method as claimed in claim 1, further comprising extracting at least one of cell content substances and building blocks of protein shells from cells in a pharmaceutical or chemical process, using the Marx generator.

4. The method as claimed in claim 3, further comprising causing blood flow due to cell breakdown caused by the Marx generator.

5. The method as claimed in claim 1, further comprising analyzing at least one of asphalt and concrete samples by electrohydraulic disintegration and breakdown thereof caused by the Marx generator.

6. The method as claimed in claim 1, further comprising recycling of at least one of concrete and asphalt by electrohydraulic disintegration and breakdown thereof caused by the Marx generator.

7. The method as claimed in claim 1, further comprising treating water containing impurities by applying the high-voltage pulses.

8. A circuit for industrial use of intensive high-voltage pulses, comprising:
   a Marx generator having a predetermined number of individual stages and a first spark gap; and
   means for triggering said Marx generator by generating and coupling high-voltage pulses into a first stage of said Marx generator, leading to a longitudinal overvoltage triggering of the first spark gap of said Marx generator, said means including
      a pulse transformer having a primary side and a secondary side;
      a capacitive energy store; and
      a semiconductor switch which when closed generates the high-voltage pulses by discharging the capacitive energy store into the primary side of the pulse transformer.

9. The circuit as claimed in claim 8,
   wherein the first stage of said Marx generator has a frame with a line at a ground end and a charging inductance, with the secondary side of the pulse transformer inserted into the line, and
   wherein said means for triggering said Marx generator further comprises a pulse generation circuit connected to the primary side of the pulse transformer.

10. The circuit as claimed in claim 9, wherein the pulse transformer has a transformation ratio between 8:1 and 20:1, inclusive.

11. The circuit as claimed in claim 10, wherein the pulse transformer has a transformation ratio of substantially 15:1.

12. The circuit as claimed in claim 11, wherein the pulse transformer has less than three turns on the primary side.

13. The circuit as claimed in claim 12, wherein the charging inductance is between 100 µH and 2 mH, inclusive.

14. The circuit as claimed in claim 13, wherein the charging inductance is equal in all stages of the Marx generator.

15. The circuit as claimed in claim 14, wherein the pulse transformer has one of a ferrite core and a cut strip-wound core.

16. The circuit as claimed in claim 14, wherein the pulse transformer has a core substantially 10 $cm^2$ in cross section.

17. The circuit as claimed in claim 16, wherein the pulse transformer has windings applied to the core that are formed by a high-voltage-insulated wire.

18. The circuit as claimed in claim 16, wherein the pulse transformer has one of a single insulating coil former and separate coil formers, to which the windings are applied.

19. The circuit as claimed in claim 18, further comprising a chamber substantially filled with at least one of an insulating gas atmosphere and an insulating liquid that provides insulation for said circuit.

20. The circuit as claimed in claim 19, wherein the pulse transformer includes at least one casting formed of at least one resin or at least one polymer.

21. The circuit as claimed in claim 20, wherein the pulse generation circuit includes
   a capacitor that provides the capacitive energy store and can be charged up to a predeterminable voltage, and
   the semiconductor switch which is disposed in the primary winding of the pulse transformer.

* * * * *